(12) United States Patent
Wattyn

(10) Patent No.: US 12,427,713 B2
(45) Date of Patent: Sep. 30, 2025

(54) APPARATUS AND METHOD FOR GENERATING A 3D STRUCTURE

(71) Applicant: XSYS Prepress N.V., Ypres (BE)

(72) Inventor: Bart Marc Luc Wattyn, Dentergem (BE)

(73) Assignee: XSYS PREPRESS N.V., Ypres (BE)

( * ) Notice: Subject to any disclaimer, the term of this patent is extended or adjusted under 35 U.S.C. 154(b) by 0 days.

(21) Appl. No.: 16/861,366

(22) Filed: Apr. 29, 2020

(65) Prior Publication Data

US 2020/0353675 A1 Nov. 12, 2020

(30) Foreign Application Priority Data

May 6, 2019 (NL) ..................................... 2023079

(51) Int. Cl.
*B29C 64/124* (2017.01)
*B29C 64/241* (2017.01)
(Continued)

(52) U.S. Cl.
CPC .......... *B29C 64/124* (2017.08); *B29C 64/241* (2017.08); *B29C 64/245* (2017.08);
(Continued)

(58) Field of Classification Search
CPC . B29C 37/0025; B29C 64/236; B29C 64/245; B29C 64/264; B29C 64/241;
(Continued)

(56) References Cited

U.S. PATENT DOCUMENTS 5,198,159 A 3/1993 Nakamura et al.
9,002,496 B2 * 4/2015 Elsey .................... B29C 64/188
425/375
(Continued)

FOREIGN PATENT DOCUMENTS

DE 4308189 C1 3/1994
GB 2160989 * 1/1986
WO 2017116678 A1 7/2017

OTHER PUBLICATIONS

P. de Beer, Martin, "Rapid, continuous additive manufacturing by volumetric polymerization inhibition patterning." Science advances vol. 5,1 eaau8723. Jan. 11, 2019, doi:10.1126/sciadv.aau8723 (Year: 2019).*

(Continued)

Primary Examiner — Michael A Tolin
Assistant Examiner — Hana C Page
(74) Attorney, Agent, or Firm — KDW Firm PLLC

(57) ABSTRACT

An apparatus for generating a three-dimensional structure using a solidifiable material (M) includes a support structure configured for providing a support surface, wherein the support surface may be formed by a substrate intended to be part of the three-dimensional structure to be generated or by a support not intended to be part of the three-dimensional structure to be generated. A container is provided for receiving the solidifiable material. A first irradiating means is located behind the support surface and configured to emit irradiation, through said support surface, in an irradiation area in the solidifiable material, between the support surface and the container to solidify the solidifiable material at the support surface. The support structure is configured to allow said irradiation to pass through the support surface.

15 Claims, 9 Drawing Sheets

(51) Int. Cl.
*B29C 64/245* (2017.01)
*B29C 64/264* (2017.01)
*B33Y 10/00* (2015.01)
*B33Y 30/00* (2015.01)
*B33Y 80/00* (2015.01)
*B29L 31/00* (2006.01)

(52) U.S. Cl.
CPC ............ *B29C 64/264* (2017.08); *B33Y 10/00* (2014.12); *B33Y 30/00* (2014.12); *B29L 2031/767* (2013.01); *B33Y 80/00* (2014.12)

(58) Field of Classification Search
CPC ..... B29C 64/124; B29C 64/129; B41C 1/003; B41C 2210/08; B29L 2031/767; G03F 7/70416; G03F 7/2012; B33Y 10/00; B33Y 30/00
USPC ......................................................... 264/494
See application file for complete search history.

(56) References Cited

U.S. PATENT DOCUMENTS

| | | | |
|---|---|---|---|
| 10,589,507 B2* | 3/2020 | El-Siblani | B29C 64/241 |
| 10,703,085 B2* | 7/2020 | Yasukochi | B29C 64/241 |
| 2017/0136688 A1* | 5/2017 | Knecht | B29C 64/129 |
| 2018/0355221 A1* | 12/2018 | Franke | B23K 26/082 |
| 2019/0084230 A1* | 3/2019 | Stadlmann | B29C 64/286 |
| 2020/0307084 A1* | 10/2020 | Kajita | B29C 64/268 |

OTHER PUBLICATIONS

International Search Report and Written Opinion for Application No. NL2023079, received Apr. 28, 2020, 8 pages.

* cited by examiner

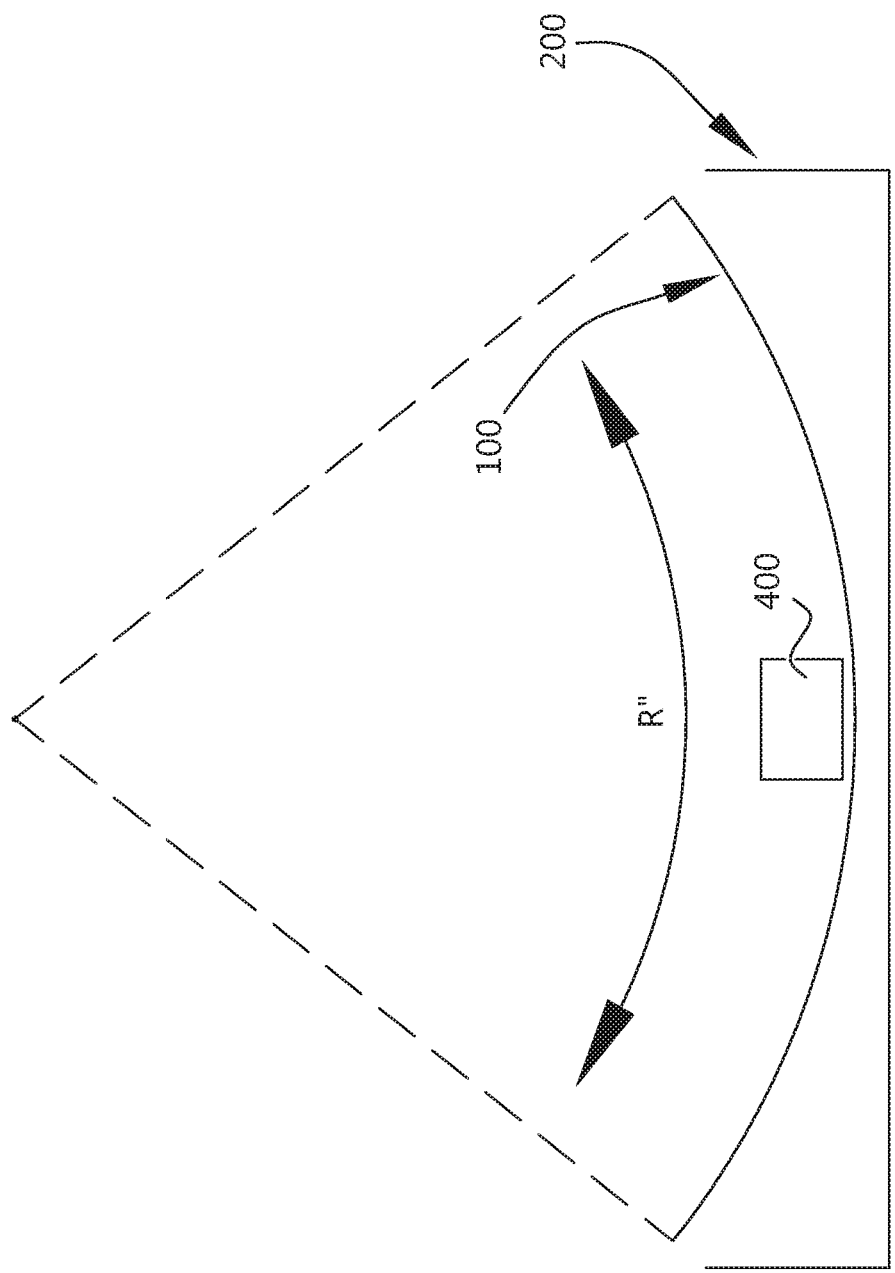

APPARATUS AND METHOD FOR GENERATING A 3D STRUCTURE

CROSS-REFERENCE TO RELATED APPLICATIONS

This application claims priority to Netherlands patent application serial number 2023/079, filed May 6, 2019, the entirety of which application is incorporated by reference herein.

FIELD OF INVENTION

The field of the invention relates to apparatuses and methods for generating a three-dimensional structure, in particular a relief carrier, such as a relief plate or sleeve, more in particular s a printing plate or printing sleeve, using a solidifiable material. Particular embodiments relate to the field of generating an image relief plate or sleeve for printing.

BACKGROUND

Flexographic printing or letterpress printing is a technique which is commonly used for high volume printing. Flexographic or letterpress printing plates are relief plates with image elements protruding above non-image elements in order to generate an image on a recording medium such as paper, cardboard, films, foils, laminates, etc. Flexographic or letterpress printing plates are typically sufficiently flexible to be wrapped around a printing cylinder. Also, cylindrically shaped printing plates or sleeves may be used.

Various methods exist for making flexographic printing plates. According to conventional methods flexographic printing plates are made from multilayer substrates comprising a backing layer and one or more photocurable layers. Those photocurable layers are imaged by exposure to electromagnetic radiation through a mask layer containing the image information or by direct and selective exposure to light e.g. by scanning of the plate to transfer the image information in order to obtain a relief plate.

According to another known method, printing plates are made using an additive manufacturing or 3D printing production method. In such methods, the construction of the layers may be carried out layer per layer by solidifying material e.g. by photocurable polymer resin using UV light radiation or by melt deposition. The successive layers may be formed on the top side of a growing layer structure in an additive manner. Other improved methods use a continuous liquid interface printing method. Such a continuous process uses a reservoir of solidifiable material with a bottom which is transparent for radiation capable of solidifying the solidifiable material. A carrier substrate, which is the substrate on which the relief structure is to be built, is initially in direct contact with the solidifiable material. Subsequently the substrate is moved away from the bottom of the reservoir after polymerization occurred and fresh liquid material fills the gap. The formation of solidified material on the surface of the substrate is a continuous process and the solidified material is in constant contact with the solidifiable material in the reservoir until the formation of the printing plate is complete. Such continuous liquid interface printing methods can avoid problems with cleavage lines which occur for stepwise methods. Also, the time needed to produce a printing plate can be reduced compared to conventional methods. However, when using such methods, the solidified material may stick to the bottom wall of the container which may lead to destruction of the structures formed. Also, the feeding of fresh solidifiable material into the gap formed between the growing substrate and the bottom wall may be slow and difficult, especially when the solidifiable material is too viscous. This limits the achievable speed of the production process and the quality of the resulting printing plates.

In addition most of the additive processes are performed in a planar configuration. In printing applications, plates carrying the relief have to be mounted on printing cylinders, which imposes mechanical stress on the relief surface due to bending. This mechanical stress can result in lower mechanical stability, and hence in shorter print length.

SUMMARY

The object of embodiments of the invention is to provide an apparatus and method for generating a three-dimensional structure, in particular a relief carrier using a solidifiable material, which is faster and more reliable than the known apparatuses and methods. More in particular, it is desirable to be able to generate three-dimensional structures, such as relief carriers, especially printing plates or printing sleeves in a faster and more reliable manner using a solidifiable material. Furthermore, it is desirable to provide a method and apparatus, which work well for viscous solidifiable materials.

According to a first aspect of the invention there is provided an apparatus for generating a three-dimensional structure using a solidifiable material. The apparatus comprises a support structure, a container and an irradiating means. The support structure is configured for providing a support surface, wherein the support surface may be formed by a substrate intended to be part of the three-dimensional structure to be generated or by a support not intended to be part of the three-dimensional structure to be generated. In other words, the support structure may be a support structure intended to be used with a substrate or may be a support structure intended to be used without a substrate arranged thereon or may be a support structure which can be used either with or without a substrate. The container is configured for receiving the solidifiable material. The first irradiating means is located behind the support surface and configured to emit irradiation, through said support surface, in an irradiation area between the support surface and the container to solidify the solidifiable material at the support surface. The support surface is configured to allow said irradiation to pass through the support surface.

By arranging the first irradiating means behind the support surface such that it can emit irradiation, through said support surface in the solidifiable material, in an irradiation area between the support surface and the container, at least a first solidified layer or pattern can be arranged easily on the support surface. This provides an extra degree of flexibility to the apparatus compared to apparatus of the prior art where irradiation is done through a wall of the container. According to an exemplary embodiment, the apparatus further comprises moving means. The first moving means may be configured to move the support surface relative to the container, such that subsequent areas of the support surface face the irradiation area during the moving. The support surface may be moved relative to the container, implying that either the support surface is moved, or the container is moved, or both the support surface and the container are moved. In other embodiments the first irradiating means may be moved relative to the support surface.

According to an exemplary embodiment, the apparatus further comprises a controller configured to control the movement means and the first irradiating means such that subsequent adjacent longitudinal zones of the support surface are irradiated, said longitudinal zones extending parallel to the support surface.

The support structure may be flat or curved, and in particular substantially cylindrical, or the support structure may be configured for receiving a flat or curved, and in particular a cylindrical carrier, such as a hollow cylinder or sleeve. The substrate may be e.g. a flat flexible plate or sheet or film arranged around the support structure or a cylindrical structure or a cylinder section. When a cylindrical carrier such as a cylindrical sleeve is used, the support structure may be cylindrical but does not need to be cylindrical.

By providing a cylindrical support surface, i.e. either a cylindrical surface of a substrate arranged on the support structure or a cylindrical surface of the support structure itself, solidifiable material in the container can reach the irradiation area more easily compared to known solutions where the substrate is arranged on a plate. Indeed, as solidified material is moved away from the irradiation area, fresh solidifiable material can flow towards the irradiation area from an immediately adjacent area where plenty of solidifiable material is present because of the cylindrical shape. In that manner, even for viscous materials, fresh material is brought easily into the irradiation area. The speed of that flow is not limiting the speed of the moving means, and hence the solidifiable material that is being used may be more viscous than in the prior art, whilst still achieving a good result.

According to an exemplary embodiment, the first irradiation means is configured to selectively emit radiation in order to expose selected areas only.

According to an exemplary embodiment with a substantially cylindrical support surface, the moving means may be configured to rotate the support surface around an axis of the support surface. Because of the rotation of the support surface, fresh material adhering to the surface upstream of the irradiation area may be pulled into the irradiation area.

Preferably, the moving means is configured to allow the support surface to be provided with solidified material over substantially 360°. Typically, this will imply one or more rotations of the support structure around its axis over 10° to 360°. Even though the device is typically able to be rotated over 360°, the rotation may also be conducted over less degrees from 10° to 360°, preferably from 45° to 360°, more preferably from 90° to 360°, most preferably form 180° to 360° and most of the time from 270° to 360°. The rotation may start at one end of the container but it is also possible to start a partial rotation at any point of the container. In that manner, one or more layers may be formed across the entire support surface or across a portion thereof.

In a preferred embodiment, the support surface describes a full cylinder. For example, in an embodiment where a substrate is used the substrate may be a sleeve-like substrate, forming a full cylinder. In a preferred embodiment, the support structure comprises a drum on which a flexible substrate can be fixed. Alternatively, the drum may be used without a substrate, wherein first a full layer of solidified material is grown on the drum. In other embodiments, the support structure may comprise two cones configured to be inserted in opposite ends of a sleeve-like substrate such that the cylindrical substrate is clamped and can be rotated.

According to an exemplary embodiment with a flat support surface, the moving means may be configured to move the support surface relative to the first irradiating means.

According to an exemplary embodiment, the container has a wall arranged such that the support surface is at a determined distance (t) of the wall. In an embodiment with a substantially cylindrical support surface, the wall may be arranged substantially parallel to an axis of the support surface. In an embodiment with a flat support surface, the wall may be arranged substantially parallel to the support surface.

In that manner the irradiation area can be defined between the wall and the support surface, resulting in a neatly defined boundary of the solidified material.

Preferably, the wall is a bottom wall of the container, preferably a flat bottom wall. The wall may be provided on a surface inside the container with an anti-stick coating configured to limit sticking to solidified material. The wall may be transparent to irradiation and/or inhibitors, especially when a second irradiation means is used, see further, or the wall may be non-transparent to irradiation and/or inhibitors and/or reflective to irradiation, when no second irradiation means is used.

According to an exemplary embodiment, the container has a wall arranged such that the support surface is at a distance (t) of the wall, wherein the distance is lower than 20 mm, preferably in the range of 0.1 μm up to 10000 μm, more preferably in the range of 1 μm to 7000 μm, even more preferably lower than 5000 μm and most preferably lower than 3000 μm. It is noted that the distance may be increased on a layer per layer basis if multiple layers are being applied.

In an exemplary embodiment, the irradiation area extends from the support surface to the wall, and is delimited by the support surface and the wall.

According to an exemplary embodiment the wall is provided on a surface inside the container with an anti-stick coating configured to limit sticking to solidified material.

According to an exemplary embodiment the wall is transparent to irradiation and/or inhibitors. According to an exemplary embodiment the wall is nontransparent to irradiation and/or inhibitors and/or reflective to irradiation.

According to an exemplary embodiment with a substantially cylindrical support surface, the moving means may be configured to move the axis of the support surface parallel to the wall of the container, whilst rotating the support surface around the axis. In that manner, the support surface can be more or less "rolled" over fresh solidifiable material as a layer of solidified material is being formed on the support surface. Seen at the irradiation area, the rotation direction of the support surface is preferably opposite to the movement direction of the support surface relative to the wall of the container. In other words, the support surface is translated relative to the wall of the container in a direction away from the side of the support surface on which the layer is being formed.

According to a further developed embodiment with a substantially cylindrical support surface, the moving means is configured to translate and rotate the support surface relative to the wall, such that for each degree of rotation of the support surface, the support surface is translated relative to the wall over a distance which is within 20% of a value calculated as $\pi$ multiplied with the outer diameter d of the support surface divided by 360 ($\pi*d/360$), preferably within 10% of said value. In other words, the movement performed by the support surface is as if the support surface rolls over a virtual surface. In that manner, any disturbance or stirring of the solidifiable material in the container is limited, the force to remove solidified material from the wall is low due to a limited adhesion area, and detachment occurs in a gentle and gradual fashion resulting in a neatly formed solidified layer on support surface. It is noted that the translation speed may be adjusted in function of the thickness of the substrate (when a substrate is used) and/or in function of the number of layers formed on the support surface, in order to compensate for the increased diameter.

According to an exemplary embodiment, the moving means is configured to translate the support surface and/or to translate the container and/or to translate the irradiation area (e.g. by translating the irradiation means or a portion thereof or by selectively activating irradiation sources thereof). More in particular, the support surface may be translated parallel to the wall of the container, and/or the container may be translated such that the wall moves parallel to the axis of the support surface. An advantage of translating the support surface is that the apparatus may be more compact. An advantage of translating the container, is that both the support surface and the first irradiating means may remain fixed. However, it is also possible to couple the support surface and the first irradiating means, and to move those together relative to the container. In yet another variant, the support surface and the container are fixed and the irradiation area is translated along the support surface with a further moving means. Depending on the nature of the irradiation means, either the irradiation means may be moved as a whole or only the irradiation area may be moved. The latter may be case for e.g. a laser beam, an LED array which has selectively addressable LEDS, a projection device e.g. with moving mirrors, a display or an addressable masking device in between support and a flood exposure device.

According to a preferred embodiment, the apparatus further comprises first adjustment means configured to change the distance between the wall and the support surface. In that manner, after a first layer of solidified material has been grown on the support surface or on a previous layer, the distance between the wall and the support surface may be changed, such that a new gap is formed between the surface of the last layer and the wall. Thereupon a second layer may be grown on the first layer. Repetition of these steps allows growing a relief structure with multiple layers.

In addition or alternatively, the apparatus further comprises a second adjustment means configured to change the distance between the first irradiating means and the support surface. Thus, the second adjustment means allow to vary the position of the irradiation area in function of the number of layers grown. Preferably, the adjustment done by the second adjustment means is such that the distance between the wall and the first irradiating means remains the same. More generally, the apparatus may comprise irradiation adjustment means configured to adjust the focus distance and/or the intensity of the irradiation emitted by the first irradiation means and/or to adjust the shape and/or the size of the irradiation area.

According to an exemplary embodiment, the apparatus further comprises a second irradiating means outside the container and configured to irradiate a second irradiation area through the wall, wherein the second irradiation area may be the same or different from the irradiation area of the first irradiating means. The second irradiating means may be used simultaneously with the first irradiating means such that the size of the total irradiation area can be larger and/or such that the irradiation power in the total irradiation area is larger. However, it is also possible to use the first and second irradiating means one after the other, and in particular alternating. For example, one or more first layers may be grown using the first irradiating means and one or more second layers may be grown using the second irradiating means.

The apparatus may further comprise an irradiation moving means configured to translate the second irradiating area of the second irradiating means with respect to the wall in synchronization with the support surface. The second irradiating means may also be moved parallel to the wall of the container. In addition, the movement of the irradiation area of the second irradiating means may be performed by moving the second irradiation area generated by a light source e.g. by means of moving mirrors, activation of selected LEDs of a LED array or a moving beam or a combination thereof.

According to an exemplary embodiment, the controller is further configured to control the second irradiating means, and optionally the irradiation movement means associated therewith.

According to an exemplary embodiment, the first and/or second irradiating means comprises one or more irradiating elements arranged in one or more lines.

According to an exemplary embodiment, the first and/or second irradiating means comprise any one of the following or a combination thereof: a UV irradiating means, an infrared irradiating means, a laser means, a scanning means, a projection means, a LED array, a liquid crystal display, an active matrix (O)LED display.

According to an exemplary embodiment, the apparatus further comprises a controller configured to control the moving means and/or the first and/or second irradiating means such that subsequent adjacent longitudinal zones of the support surface are irradiated. These longitudinal zones may extend parallel to the axis of the support surface if the support surface is substantially cylindrical, or parallel to the support surface if the support surface is flat. For example, the first and/or second irradiating means may be configured to irradiate a longitudinal zone having a width between 0.1 and 20 mm. Depending on the type of irradiating means that is being used, this may correspond to 1 to 2000 lines of irradiating elements. For example, one line of elements could consist of a line of LEDs, or 20 to 100 laser lines can form the irradiation area. It is noted that this is merely an example, and that other widths and a different number of lines may also be used in embodiments of the invention.

Preferably, the moving of the support surface (translation and/or rotation) and/or the moving of the first and/or second irradiating means is a more or less continuous process in the sense that the support surface is continuously moved and/or that the first and/or second irradiating means are continuously and selectively irradiating. However, it is also possible to provide a controller configured to control the moving means and/or the first and/or second irradiating means such that movement and/or irradiation are performed in steps. The segments or areas of these steps may partially overlap or be adjacent to each other.

In a typical embodiment, the controller is configured to control the moving means, and/or the first and/or second adjustment means and/or the first and/or second irradiating means, such that one or multiple layers of solidified material are formed on the support surface. Preferably at least one layer of said one or multiple layers covers more than 90°, more preferably 180°, most preferably substantially 360°. In other words, preferably the one or multiple layers are formed on a large portion of the support surface.

More preferably, the controller is configured to control the moving means, and/or the first and/or second adjustment means and/or the first irradiating means, such that, at least one full layer of solidified material is formed on the support surface to form a floor. In other words, by forming one or multiple layers on the support surface, a relief structure can be formed. Such a method allows producing relief structures at improved speeds, with a good image quality. When working without a substrate, a floor will be formed first. However, when working with a substrate it is also possible to omit the floor.

According to a preferred embodiment, the controller is configured to control the moving means, and/or the first and/or second adjustment means and/or the first and/or second irradiating means such that at least one structured layer of solidified material is formed. By repetition of this movement, a three-dimensional relief is achieved.

According to a preferred embodiment, the moving means is configured to translate the support surface relative to the container in a forward direction from an initial position to an end position, whilst optionally the support surface is being rotated, and next, in a backward direction from the end position back to the initial position. It is also possible to move the support surface farther away from the wall of the container and move it backward with or without rotation and repeat the formation of the next layer in forward direction. During the movement in the backward direction, the irradiation may be stopped or may continue. If the irradiation is continued whilst moving the support surface in the backward direction, then optionally the support surface is also rotated when it is being moved in the backward direction. By irradiating both when the support surface is moved in the forward direction and in the backward direction, further time savings can be achieved. In the event that structures shall be built in a partial area of the support surface the exposure may be limited to those areas while during movement without exposure the movement speed may be increased and the light source may be switched off in order to save time and/or energy.

According to an exemplary embodiment, the wall is a bottom wall of the container, preferably a flat bottom wall. Such a container is simple and robust, and allows for a good alignment with the support surface. However, it is also possible to provide a container with a curved wall, e.g. a bottom wall portion with a cylindrical section arranged parallel to the axis of the support surface or to the support surface. In a possible embodiment, the bottom wall of the container has an upwardly curved cylindrical section which faces a downwardly curved cylindrical section or flat section of the support surface, wherein an axis of this support surface or the flat section is parallel to an axis of the cylindrical section of the bottom wall. By using such opposite sections (see also the embodiment of FIG. 3), fresh solidifiable material can easily flow towards the area to be irradiated. The first irradiating means are preferably located centrally above the cylindrical bottom wall section, such that the area with the smallest gap between the support surface and the bottom wall is irradiated. Optionally a second irradiating means may be located centrally below the cylindrical bottom wall section, such that the area with the smallest gap between the support surface and the bottom wall can be irradiated also by the second irradiation means. According to another possible embodiment, the container may be formed as a cylinder or partial cylinder having an axis which is parallel to the axis of a cylindrical support surface, wherein the axes of the container and the support surface are located at a distance of each other and wherein the diameter of the cylindrical container is larger than the diameter of the completely built structure (support structure with optional substrate plus built layers). Using a closed cylinder can be advantageous to keep the system free of dust and avoid evaporation of volatile material from the container. A container formed as an open or partial cylinder makes loading of the optional substrate and unloading of the generated relief carrier easier. The first and/or second irradiating means is arranged to irradiate an area between the support surface and the container, where the gap is smallest (see also the embodiment of FIG. 4). In order to limit any disturbance of the solidifiable material in the container, both the support surface and the container may be rotated in the same direction, e.g. at more or less the same speed. Also in such embodiments, the solidified material on the support surface can gradually be removed from the bottom wall of the container, whilst fresh solidifiable material flows towards the area to be irradiated. In this setup the amount of solidifiable material in the container may be significantly reduced.

In a possible embodiment, the wall is provided on a surface inside the container with an anti-stick layer configured to limit sticking to solidified material. This will further improve the loosening of the solidified layer from the wall of the container, as the support surface is moved. Such layer is preferably a film or coating with low surface energy e.g. fluor or silicon containing materials, like Teflon, silicones or organo-silicones.

When second irradiations means are present, the wall and/or parts of the wall may be transparent to electromagnetic radiation and/or inhibitors. Similarly, the support surface (and thus the support and the substrate, if a substrate is present) and/or parts of the support surface are transparent to electromagnetic radiation and/or inhibitors. Transparence to electromagnetic radiation is typically above 50%, preferably above 60%, more preferably above 70%, most preferably above 80% in the wavelength range used for irradiation. The electromagnetic waves may be e.g. any one of the following: broadband electromagnetic waves, narrow band electromagnetic waves, monochromatic electromagnetic waves, large area electromagnetic waves e.g. with a lamp, selective electromagnetic waves, e.g. emitted by a laser, waves emitted along the full axial length of the drum or along a portion of the axial length of the drum, continuous or pulsed electromagnetic waves, high or low energy electromagnetic waves, UV to IR electromagnetic waves. The wavelength of the electromagnetic waves may be in the range from 200 to 20000 nm, preferably in the range of 250 to 15000 nm, more preferably in the range of 300 to 11000 nm, most preferably in the range of 350 to 11000 nm. The total power of the irradiation may range from low values which are enough to trigger a chemical reaction to high values causing fast heating of material, e.g. in the range form 0.1 mW to 2000 W, preferably from 1 mW to 1000 W, more preferably from 5 mW to 7500 W, most preferably from 1 W to 200 W.

Transparency for inhibitors can be achieved by layers or membranes, which allow inhibitors for the solidifying reaction to diffuse through them and to prevent the solidification in close proximity of the wall surface. In this way, adhesion to the wall is prevented and forces are reduced during lifting of the solidified material. One of the most commonly used solidification reactions is radical polymerization and/or crosslinking which is inhibited by oxygen. Hence layers with high diffusion coefficients for oxygen or porous layers can be used to reduce forces during loosening of the solidified layer from the wall of the container. Such layers with high oxygen diffusion coefficient are for example silicones, fluorinated polymers, LD-PE, natural and artificial rubbers.

In a further embodiment, the wall is non-transparent to irradiation and/or inhibitors and/or reflective to irradiation.

Indeed, when there is only the first irradiation means, the wall can be of any material. This material may be transparent or nontransparent for electromagnetic radiation and/or inhibitors or not. Preferably it is transparent to inhibitors but not to electromagnetic radiation. Alternatively or in addition, the wall may be covered with a material, which prevents sticking of the solidifiable material or the solidified material. In a preferred embodiment, the wall reflects the radiation emitted by the first irradiation means. A reflective wall can reduce the time needed to solidify the material. A preferred combination is a wall that reflects radiation and is transparent for inhibitors. In yet another embodiment, the wall may be configured to allow the second irradiation emitted by the second irradiation means to pass through, and to reflect the first irradiation emitted by the first irradiation means. For example, the wall may be implemented as a so-called one-way mirror or half reflective mirror.

In a preferred embodiment, the first irradiating means and/or second irradiating means comprises one or more irradiating elements arranged in one or more lines parallel to the axis of the support surface or to the support surface. Typically, ten or more lines may be provided. The first irradiating means and/or second irradiating means may comprise any one of the following or a combination thereof: a UV irradiating means (e.g. a plurality of UV LEDs), a LED array, an infrared irradiating means, a laser means, a scanning means, a projection means, a liquid crystal display, an active matrix (O)LED display. A projection means may comprise e.g. a plurality of digital micro mirrors projecting radiation beams onto the support surface. If a liquid crystal display is used, one line after another line of the liquid crystal display may be switched on while the support structure is moving. More generally, there may be provided first and/or second irradiating means which are capable of only irradiating a small elongated zone, and/or there may be provided first and/or second irradiating means capable of irradiating a wide zone covering the distance over which the support surface is being moved (e.g. a liquid crystal display). In the latter case, the first and second irradiating means will not need to be moved.

It is preferred that the first irradiating means and/or second irradiating means is capable of being controlled in a way that the intensity of small increments of the linear irradiated area can be changed or switched off in order to transfer the image information. There are a number of ways to achieve this and they largely depend on the irradiating means employed. In case of an LED array the intensity of single LEDs may be controlled or switched off. In case of a display-like light source, single pixels may be controlled or switched off. In case of a projection system employing movable micro mirrors the mirrors may be controlled to irradiate selected areas only. In case of a scanning laser beam, the laser may be controlled or switched off. It is also clear that the controller which controls the moving means and the first and/or second adjustment means may also control the first and/or second irradiation means not only in terms of movement and speed, but also in terms of intensity, beam shape and/or diameter and location of irradiation.

According to a second aspect of the invention, there is provided a method for generating a three-dimensional structure using a solidifiable material, more preferably for generating a printing plate or a printing sleeve. The method comprises:
providing a support surface, wherein the support surface may be formed by a substrate intended to be part of the three-dimensional structure to be generated or by a support not intended to be part of the three-dimensional structure to be generated;
arranging said support surface at least partially in a solidifiable material in a container; solidifying the solidifiable material by a first irradiation through the support surface, in an irradiation area between the support surface and the container.

Optionally, the method further comprises moving said support surface relative to the container such that subsequent areas can be irradiated during the moving. Alternatively or in addition, the irradiation area may be moved relative to the support surface.

Optionally, the solidifying is performed such that the support surface is provided with solidified material over the whole support area, and in particular over substantially 360° when the support surface is a full cylinder.

According to a preferred embodiment, the moving step is controlled. Optionally, the controlling is such that the support surface is moved in a forward direction in a forward direction from an initial position to an end position, whilst optionally being rotated, whereupon the support surface is moved in a backward direction from the end position to the initial position.

The irradiating may be done with one or more irradiating elements arranged in one or more lines parallel to the axis of the support surface or parallel to the support surface.

Preferred embodiments of the method are disclosed in the enclosed set of claims. The technical merits set out above in connection with the apparatus apply mutatis mutandis for the method. Also, apparatus features may be combined with method features and vice versa.

According to an exemplary embodiment, the moving comprises translating and rotating the support surface relative to the wall such that for each degree of rotation of the support surface around the axis, the axis is translated relative to the wall over a distance which is within 10% of a value calculated as $\pi$ multiplied with the outer diameter (d) of the support surface divided by 360 ($\pi*d/360$).

According to an exemplary embodiment, the solidifiable material is a viscous photosensitive material.

According to an exemplary embodiment, during one or more initial solidifying steps at least one full layer of solidified material is formed on the support surface to form a continuous layer.

According to an exemplary embodiment, during one or more solidifying steps at least one imaged layer of structured solidified material is formed to form a relief structure.

According to an exemplary embodiment, the moving comprises translating the support surface and/or translating the container.

According to an exemplary embodiment, the method further comprises increasing the distance between the wall and the support surface after a layer of solidified material has been formed.

According to an exemplary embodiment, the solidifying comprises subsequently irradiating adjacent longitudinal zones of the support surface.

According to an exemplary embodiment, the solidifying comprises solidifying multiple layers on the support surface.

According to an exemplary embodiment, the viscosity of the solidifiable material according to DIN 1342 is higher than 400 mPa*s.

According to an exemplary embodiment, the method further comprises solidifying the solidifiable material by a second irradiation with electromagnetic waves through a transparent wall of the container.

According to an exemplary embodiment, the second irradiation is performed at the same time, before or after the first irradiation or alternating to the first irradiation.

According to an exemplary embodiment, the method further comprises:
- removing the generated three-dimensional structure from the container;
- performing any one or more of the following post-treatments: removal of unsolidified material, washing, post-exposure, post treatment with chemicals, heating, grinding, addition of at least one additional layer or a combination thereof.

According to an exemplary embodiment, the method further comprises application or lamination of a further layer on top of the three-dimensional structure to form channels.

According to an exemplary embodiment an additional layer may be applied/laminated on the formed structured solidified material. By application of an additional layer, on top of the formed relief structure, devices may be created that comprise isolated and/or connected channels and spaces. The additional layer may be stiff enough so it does not sink into the channels formed or one may use a flexible layer and take care that it cannot sink into the channels e.g. by using a fluid or gas to fill the channels. Optionally the channels may be filled with other materials and fluids. Such devices may be used as microfluidic device, (e.g. for microanalytics or for high throughput screenings), as microreactors, as optical devices (e.g. as phoretic cell as described in WO2004/015491), as light controlling element (e.g. as described e.g. in WO2003/062900) or as photonic crystals. The additional layer may be applied in a post treatment step. The devices described above may be designed in a stiff or elastic fashion. Flexible devices are preferred especially when they are used at and/or in a human body, and/or in fabrics and/or in clothes.

In preferred embodiments, the solidifiable material is a viscous photosensitive coating material. The viscosity according to DIN 1342-2 may be higher than 400 mPa*s, more preferably higher than 500 mPa*s, even more preferable higher than 700 mPa*s, and most preferably higher than 1000 mPa*s. Examples of solidifiable materials that may be used in embodiments of the invention are viscous photosensitive compositions, which solidify or cure due to a chemical reaction, which leads to polymerization and/or crosslinking Such reactions may be radical, cationic or anionic polymerization and crosslinking. Other means for crosslinking are condensation or addition reactions e.g. formation of esters, ethers, urethanes or amides. Such composition may include initiators and/or catalysts, which are triggered by electromagnetic radiation. Such initiators or catalysts can be photo-initiator systems with one or more components that form radicals, acids or bases, which then initiate or catalyze a reaction, which leads to polymerization or crosslinking. The necessary functional groups can be attached to low molecular weight monomers, to oligomers or to polymers. In addition, the composition may comprise additional components such as binders, filler, colorants, stabilizers, tensides, inhibitors, regulators and other additives, which may or may not carry functional groups used in the solidification reaction. Depending on the components used, flexible and/or rigid materials can be obtained after the solidification and post treatment is finished.

The method is not limited to the use of one solidifiable material. By changing the solidifiable material in the container or exchanging the container with at least another containing a different solidifiable material it is possible to create layers made of different materials. In this way, multilayer reliefs with at least two different materials can be obtained. The layers may differ in color, and/or mechanical, chemical or physical properties.

In embodiments of the invention where a substrate is used, the substrate may be e.g. a flat flexible plate or sheet or film or a cylindrical sleeve or sleeve section. Suitable sleeves may comprise, for example, layers of polyester, polyacrylate, polyurethane or epoxy resin, the layers being customarily reinforced with woven or non-woven fibers or fiber mats. The fibers may be selected form polymer fibers (made of polyester, polyamide, polyaramid, polyimide, polyethylene, polypropylene), glass fibers or carbon fibers. Preferably, glass fibers are used. Suitable dimensionally stable support layers, e.g. flexible plates, films or sheets, typically have a thickness of 50 to 1000 micrometer. The material of the support layer may comprise, for example plastics such as, for example, polyesters such as polyethylene terephthalate, polybutylene terephthalate, polyethylene naphthalate, polyurethanes or polycarbonates. Especially suitable are PET films having a thickness of 100 to 200 micrometer.

According to another aspect, the invention relates to the use of three-dimensional structures, in particular relief carriers, preferably manufactured according to any one of the embodiments disclosed above, as flexographic printing plate or sleeve, letterpress plate or sleeve, tampon printing plate or sleeve, intaglio printing plate or sleeve, microfluidic device, micro reactor, phoretic cell, photonic crystal and optical device.

According to another aspect, the invention relates to a three-dimensional structure, in particular a relief carrier, obtained by the method according to any one of the embodiments above.

According to another aspect of the invention there is provided a three-dimensional structure, in particular a relief carrier having a base layer and a relief layer. The relief layer is formed as a stepped profile of solidified material, wherein the height of a step of the stepped profile is smaller than 0.5 millimeter, preferably smaller than 300 micrometer.

Such a three-dimensional structure, in particular a relief carrier has the advantage that the relief areas are provided in a stable manner, being narrower at the top than at the bottom. Also, by using steps, a precise and well aligned relief structure can be obtained.

The overall height or thickness of the relief layer built may be in the range of 0.1 μm up to 10000 μm, preferably in the range of 1 μm to 7000 μm, more preferably in the range of 100 μm to 5000 μm and most preferably in the range of 100 μm to 3000 μm.

Preferably, the stepped profile comprises a plurality of relief areas, wherein at least one relief area has an upper landing and at least one flight of steps between the base layer and the upper landing. When the three-dimensional structure, in particular a relief carrier is used for printing purposes, the upper landings may define accurately an image to be printed, whilst the steps can guarantee sufficient stability and flexibility of the relief areas during printing. The upper landing may have a curved surface, as the relief layer may be build by forming a plurality of cylindrical layers on a cylindrical support surface, as has been described above in connection with embodiments of the method and the apparatus.

By application and solidification of the layers which create the steps, in a curved form, the surface layers of the three-dimensional structure, in particular a relief carrier are not mechanically stressed when mounted in a cylindrical manner, as on the support structure. This is an additional advantage over relief structures of the prior art, which are manufactured in a planar manner and next bent for mounting on a cylinder, e.g. for printing purposes.

According to an exemplary embodiment, the upper landing is substantially surrounded by the at least one flight of steps. This will further enhance the stability of the relief areas. However, in other embodiments it may be sufficient to provide flights of steps at certain edges of the upper landing, and not at all edges of the upper landing. In some cases, it may be sufficient to have steps at only one side or not at all sides of the landing. For example, steps may be provided parallel to edges extending in the axial direction of the support structure, whilst not providing steps at edges perpendicular to the axial direction of the support structure. The steps may be used to mechanically stabilize the relief structure in one or several directions in which a stabilization is required by the later application.

Preferably, each flight of steps comprises at least two steps, preferably at least three steps, more preferably at least five steps. It is noted that each step may comprise one or more layers of solidified material, i.e. each step may be grown through one or more passes of the first and/or second irradiating means. The step dimensions and/or shapes of adjacent steps of a flight of steps may be the same or different. Optionally, when the relief carrier is intended to be used for printing, the step dimensions and/or shapes may be determined based on the image to be printed.

The width of the steps may be the same for all steps or it may vary in a way that the width of the steps close to the substrate is larger than the width of the steps close to the landing or the other way around. The width of the steps from bottom to top or from top to bottom may change in a linear, polynomial, logarithmic or exponential fashion. The width of the steps may be in the range of 1μ to 5000 μm, preferably in the range of 10 μm to 3000 μm, more preferably in the range of 10 μm to 1000 μm, most preferably in the range of 10 μm to 500 μm.

According to an exemplary embodiment, the three-dimensional structure, in particular a relief carrier is a relief sleeve with a cylindrical base layer. However, in other embodiments the relief carrier may be a relief cylinder segment or a flexible relief plate. Preferably the stepped profile is provided over more than 20°, preferably over more than 90°, more preferably over more than 180°, even more preferably over more than 270°, and most preferably over substantially 360° of the outer surface of the relief carrier. In that manner the carrier can be optimally used. When the relief carrier is used for printing, the skilled person understands that the relief areas, and hence the stepped profile will depend on the image to be printed, and that certain areas of the relief carrier corresponding with non-printing areas, may be void of any relief structures.

Preferably, the three-dimensional structure, in particular a relief carrier has a maximum thickness which is smaller than 20 mm, preferably smaller than 10 mm, more preferably smaller than 7 mm. In that manner the three-dimensional structure can be sufficiently stable whilst not being too rigid. The overall height or thickness of the relief layer built on the base layer may be in the range of 0.1 μm up to 10000 μm, preferably in the range of 1 μm to 7000 μm, more preferably in the range of 100 μm to 5000 μm and most preferably in the range of 100 μm to 3000 μm.

Preferably, a step of the stepped profile is delimited by a riser wall oriented within 20° from a radial direction, preferably within 10° from a radial direction of a cylindrical support surface on which the relief areas have been formed. Even more preferably, a step of the stepped profile is delimited by a wall oriented substantially radially. It is noted that the three-dimensional structure may be cylindrically shaped, and in that case the radial direction corresponds with a radial direction of the cylinder shape. Alternatively, the three-dimensional structure is a flexible plate which is mounted on a cylindrical surface, and the radial direction then corresponds with a radial direction of the cylindrical surface.

According to a yet another aspect of the invention, there is provided a method for generating a three-dimensional structure, in particular a relief carrier using a solidifiable material, more preferably for generating a printing plate or a printing sleeve, based on image data. The method comprises:

providing a support surface, in particular a substantially cylindrical support surface, wherein the support surface may be formed by a substrate intended to be part of the three-dimensional structure to be generated or by a support not intended to be part of the three-dimensional structure to be generated;

determining a stepped structure comprising a plurality of relief areas based on the image data;

applying a plurality of layers of a solidifiable material on the support surface in order to obtain the stepped structure on said support surface, wherein preferably at least one layer thereof is applied using irradiating through the support surface (e.g. in accordance with any one of the embodiments of the apparatus or method disclosed above).

Preferably the stepped structure is determined such that at least one relief area has an upper landing and at least one flight of steps between a base layer and the upper landing. The base layer may correspond to the substrate and/or one or more layers of solidified material. When a substrate is used, the one or more layers of solidified material are optional. When no substrate is used the base layer may be formed by one or more layers of solidified material.

The preferred features set out below for the three-dimensional structure, in particular a relief carrier with a stepped profile may also be present in the determined stepped structure. More in particular, based on the image data, the number and/or dimensions and/or shape of the steps of the relief areas may be determined.

Further, any method steps defined above in connection with embodiments of the method may be used in the method according to the last aspect.

BRIEF DESCRIPTION OF THE FIGURES

The accompanying drawings are used to illustrate presently preferred non-limiting exemplary embodiments of devices of the present invention. The above and other advantages of the features and objects of the invention will become more apparent and the invention will be better understood from the following detailed description when read in conjunction with the accompanying drawings, in which:

FIGS. 6-10 illustrate schematic cross sections of further exemplary embodiments of the apparatus;

DESCRIPTION OF EMBODIMENTS

Figure 1A:
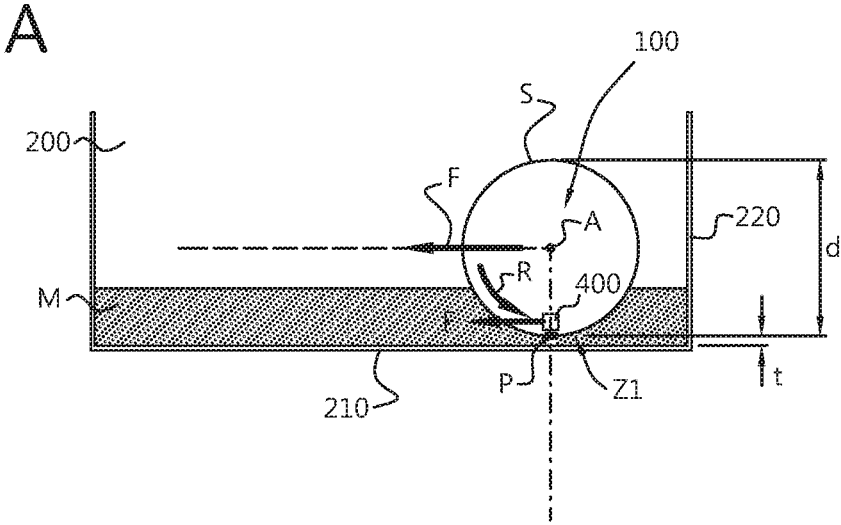
FIGS. 1A, 1B and 1C illustrate a first exemplary embodiment of a method in which the container is fixed, whilst the support structure and irradiating means are being moved.

FIG. 1A illustrates schematically an apparatus for arranging a solidifiable material M on a cylindrical support surface S. The apparatus comprises a support structure in the form of a drum 100 on which a substrate may be fixed. In another embodiment the cylindrical drum 100 itself forms a support surface on which the three-dimensional structure is built, without the use of a substrate. The apparatus further comprises a container 200 containing solidifiable material M, a moving means (not shown) configured to move the drum 100 parallel to a bottom wall 210 of the container 200, a first adjustment means (not shown) configured to adjust the distance t between the drum 100 and the bottom wall 210, and a first irradiating means 400. The container 200 has a bottom wall 210 and a side wall 220. The bottom wall 210 is arranged parallel to an axis A of the drum 100. The drum 100 is arranged in the container such that the support surface S is at a determined distance t of the bottom wall 210. The first irradiating means 400 is configured to send irradiation through the support surface S in an irradiation area between the drum 100 and the bottom wall 210 to solidify the solidifiable material in that area such that it adheres to the support surface S in that area. The first irradiation means 400 may be configured to selectively emit radiation in order to expose selected areas only. The support surface S is configured to allow the irradiation to pass through the support surface S. The apparatus may further comprise a second adjustment means (not shown) configured to change the distance between the first irradiating means 400 and the support surface S. It is noted that the first adjustment means (not shown) to adjust the distance t may be configured to move the container 200 in a vertical direction and/or to move the drum 100 in a vertical direction. If the container 200 or drum 100 is moved, the first irradiating means 400 may have to be adjusted as well.

In the figure description below, when referring to a support surface S, this may be a surface of a flat substrate or a sleeve arranged on the drum 100, or this may be a surface of the drum 100 itself. In yet another embodiment, the support structure is not a drum and does not have a cylindrical support surface, but is a suitable mounting system for a cylindrical substrate. For example, the mounting system may comprise two cones.

Figure 1B:
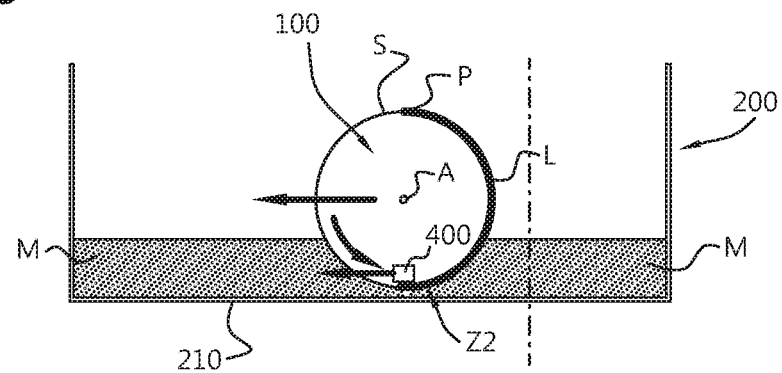
Figure 1C:
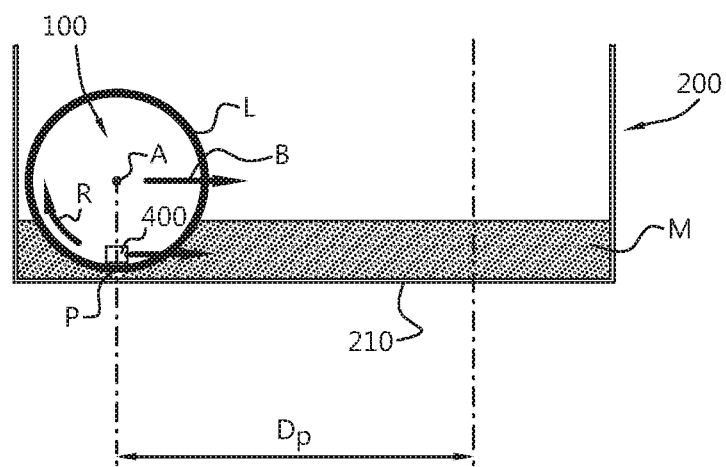

The moving means (not shown) is configured to translate the drum 100 in a forward direction F parallel to the bottom wall 210, and to rotate the drum 100 around its axis A in a rotation direction R. FIG. 1A shows the drum 100 in an initial position on the right side of the container 200. FIG. 1B illustrates an intermediate position more or less in the middle of the container 200. Point P on the support surface S which is being irradiated in the initial position of FIG. 1A is located on top of the drum 100 in the position of FIG. 1B. FIG. 1B further illustrates that a layer L of solidified material has been formed on the support surface S over substantially 180°. The drum 100 is further rotated and translated in the forwarded direction F towards the left side of the container 200, see FIG. 1C. The position shown in FIG. 1C corresponds with the end position of the drum 100. In this position a full layer L of solidified material has been formed on the support surface S and may extend over a large portion of the support surface, e.g. over substantially 360°. Now a second layer may be formed on the full layer L on the support surface S by moving the drum 100 in a backward direction B whilst rotating the drum 100 in an opposite rotation direction R. In the embodiment of FIGS. 1A-1C the first irradiating means 400 is translated synchronously with the drum 100. The moving means may be configured to translate the first irradiating means 400 synchronously with the drum 100. However, it is also possible to provide an first irradiating means which extends along the distance Dp between the initial position of FIG. 1A and the end position of FIG. 1C. In such an embodiment, the switching on of the lines of the first irradiating means 400 may be synchronized with the translation movement of the drum 100.

In a possible embodiment, during one or more initial rotations of the support surface over 10° to 360° in the forward/backward direction F/B, at least one full layer of solidified material may be formed on the support surface S to form a floor. During one or more subsequent rotations over 10° to 360° in the forward/backward direction F/B at least one structured layer of solidified material may be formed on the floor to form a relief structure.

In a preferred embodiment, the distance Dp between the initial position and the end position is more or less equal to the circumference of the drum 100, i.e. Dp=$\pi$*d wherein d may be the outer diameter of the whole drum 100 including the substrate (if present) and any added layer(s) when present. In other words, the drum 100 is rolled over a virtual plane at a distance t of the bottom wall 210, from the initial position shown in FIG. 1A to the end position shown in FIG. 1C. Preferably, both the rotation speed of the drum 100 and the translation velocity in the forward/backward direction F/B is constant, and is such that for each degree of rotation of the drum 100 around the axis A, the axis A is translated relative to the bottom wall 210 over a distance which is within 10% of $\pi$*d/360.

The skilled person understands that instead of translating the drum 100 and the first irradiating means 400 in the forward/backward direction F/B, it is also possible to translate the container 200 in the backward/forward direction B/F.

Figure 2A:
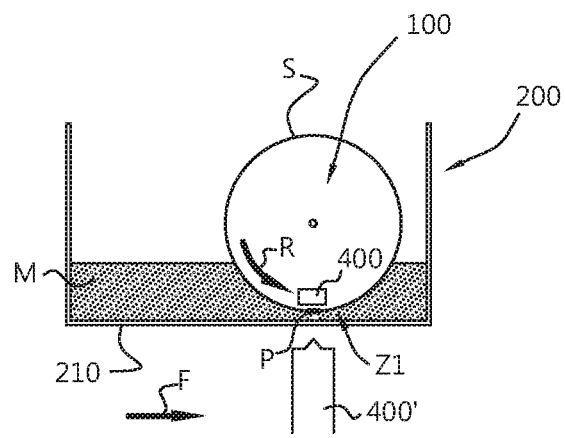
FIGS. 2A, 2B, 2C and 2D illustrate a second exemplary embodiment of a method in which the support structure is only rotated, whilst the container is being translated.
Figure 2B:
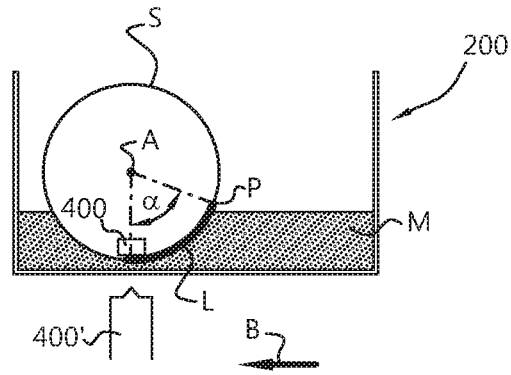
Figure 2C:
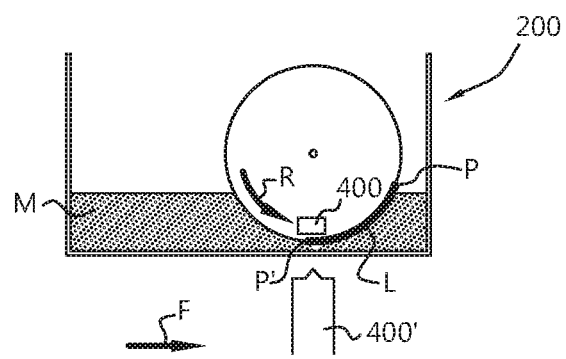
Figure 2D:
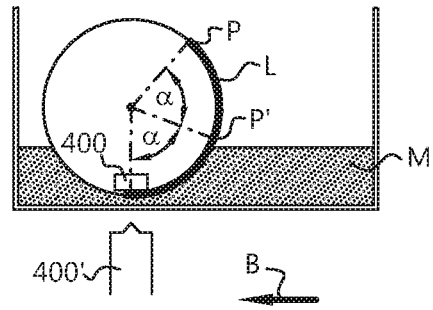

FIGS. 2A, 2B, 2C and 2D illustrate a second exemplary embodiment of an apparatus comprising a drum 100 arranged in a container 200. An first irradiating means 400 sends irradiation through a support surface S, in a similar manner as described above in connection with the embodiment of FIGS. 1A-1C. In addition, a second irradiating means 400' may be provided, configured to send irradiation through a bottom wall 210 of the container 200 in an irradiation area between the drum 100 and the bottom wall 210 to solidify the solidifiable material in that area such that it adheres to the support surface S in that area. The bottom wall 210 may be configured to allow the irradiation to pass through the bottom wall 210. The second irradiating means 400' may be located on the side of the wall 210 opposite to the solidifiable material. In the embodiment of FIGS. 2A-2D the container 200 is moved between an initial position shown in FIG. 2A and an end position shown in FIG. 2B. In this embodiment, the drum 100 is not rotated over 360° between the initial position and the end position, but is rotated over a smaller angle α as indicated in FIG. 2B. Note that point P has been moved from a first position in FIG. 2A to a second position in FIG. 2B over the angle α. Whilst the container 200 is being translated in the forward direction F from the initial position to the end position, the drum 100 is rotated in a rotation direction R, and the first irradiating means 400 and/or the second irradiating means 400' irradiate an irradiation area between the drum 100 and the bottom wall 210. In that manner, a layer L of solidified material is formed on the support surface S. This layer L extends over the angle α in the end position illustrated in FIG. 2B. Next, the container 200 is moved in the backward direction B from the end position of FIG. 2B to the initial position, see FIG. 2C. Now the container 200 is again translated in the forward direction F, whilst the drum 100 is being rotated in a rotation direction R, such that a further segment of the support surface S is covered with solidified material, see the layer L in FIG. 2D which extends over an angle equal to 2*α. In the embodiment of FIGS. 2A-2C, no irradiating is performed during the backward movement of the container 200.

The skilled person understands that instead of moving the container 200 in the embodiment of FIGS. 2A-2D, it is also possible to translate the drum 100 and the first irradiating means 400 and the second irradiating means 400' in the forward/backward direction F/B. A moving means (not shown) may be configured to translate the first irradiating means and/or the second irradiating means synchronously with the drum. The skilled person also understands that the second irradiating means 400' is optional.

Figure 3:
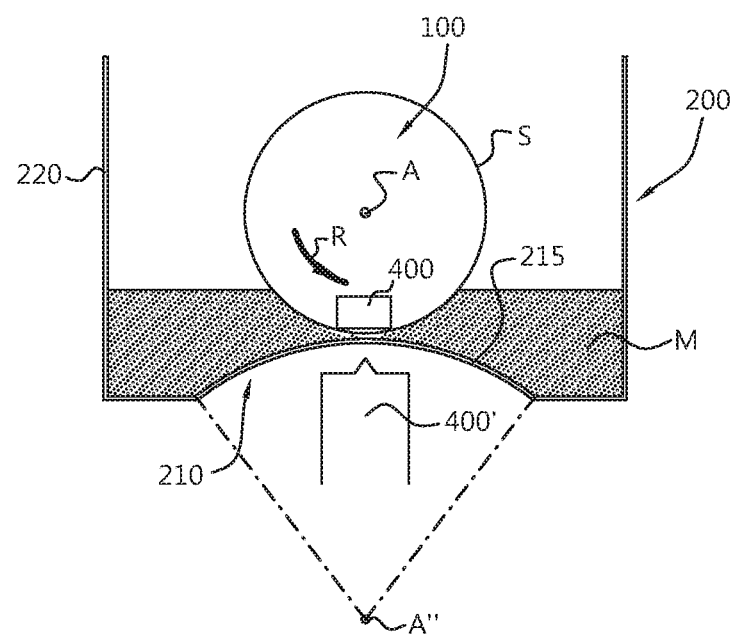
FIG. 3 illustrates a third exemplary embodiment of an apparatus for arranging a solidified material on a substrate or cylindrical carrier.
Figure 4:
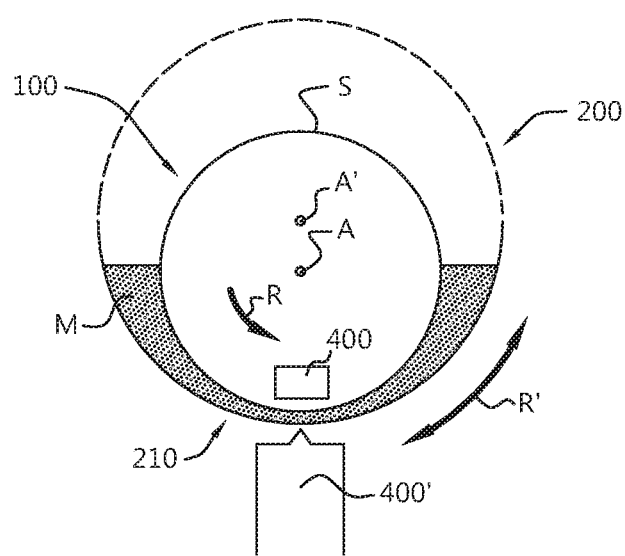
FIG. 4 illustrates a fourth exemplary embodiment of an apparatus for arranging a solidified material on a substrate or cylindrical carrier.

FIGS. 3 and 4 illustrate two further exemplary embodiments of an apparatus for arranging a solidified material on a support surface, wherein the same reference numerals refer to the same or similar components. In the embodiment of FIG. 3, the apparatus comprises a drum 100 on which a substrate may be fixed, a container 200 containing solidifiable material M, a moving means (not shown) configured to rotate the drum 100, an adjustment means (not shown) configured to adjust the distance between the drum 100 and a bottom wall 210 of the container 200, a first irradiating means 400, and a second irradiating means 400'. The container 200 has a bottom wall 210 and a side wall 220. The bottom wall 210 has an upwardly curved wall portion, here a bottom wall portion 215 with a cylindrical section arranged parallel to the axis A of the support structure, such that a gap is created between the cylindrical section 215 and the support surface S. Preferably, the first irradiating means 400, and/or the second irradiating means 400', are arranged to irradiate an area located between the axis A" of the cylindrical section and the axis A of the drum, where the gap is smallest. The upwardly curved cylindrical section 215 faces a downwardly curved cylindrical section of the support surface S. By using such opposite cylindrical sections 215, 100 fresh solidifiable material can easily flow towards the area to be irradiated. The second irradiating means 400' are preferably located centrally below the cylindrical bottom wall section 215, and the first irradiating means 400 are preferably located centrally above the cylindrical bottom wall section 215 and behind the support surface S, such that the area with the smallest distance between the drum 100 and the bottom wall 210 is irradiated.

In the embodiment of FIG. 4, the container 200 is formed as a cylinder or partial cylinder having an axis A' which is parallel to the axis A of the support structure, here a drum 100. However, the support structure could also comprise a clamping structure to clamp a cylindrical carrier with its axis A parallel to the axis A' of the container 200. The axes A, A' of the container 200 and the drum 100 are located at a distance of each other and the diameter of the cylindrical container 200 is larger than the diameter of the completely built structure (drum 100 plus optional substrate plus built layers). The container 200 may be a closed cylinder (as indicated in dotted lines) which can be advantageous to keep the system free of dust and avoid evaporation of volatile material from the container 200. However, the container 200 may also be formed as an open or partial cylinder, which makes loading of the optional substrate and unloading of the generated relief carrier easier. The first irradiating means 400 and the second irradiating means 400' are arranged to irradiate an area between the drum 100 and the container 200, where the gap is smallest. In this setup the amount of solidifiable material in the container may be significantly reduced. Both the drum 100 and the container 200 may be rotated, see the arrows R and R'. For example, in order to limit any disturbance of the solidifiable material in the container, the drum 100 and the container 200 may be rotated in the same direction. However, for other purposes, it may also be envisaged to rotate the container 200 in the opposite direction. In yet other embodiments, the container 200 may be stationary. In yet another embodiment the drum 100 and/or the container may be stationary during the exposure while the first irradiation means is moved on a cylindrical path along the support surface S and/or the second irradiation means is moved on a cylindrical path around the container. With a set of LED arrays arranged around the container, and/or a set of LED arrays arranged along the support surface S, also an irradiation area may be moved by switching LEDs on and off. In a subsequent step, the drum is rotated to contact a further area of the drum with solidifiable material and subsequently exposed by moving the first and/or second irradiation means.

In the embodiments of FIGS. 3 and 4, the solidified material on the support surface S can be removed gradually from the bottom wall of the container 200, whilst fresh solidifiable material flows towards the area to be irradiated.

Figure 5:
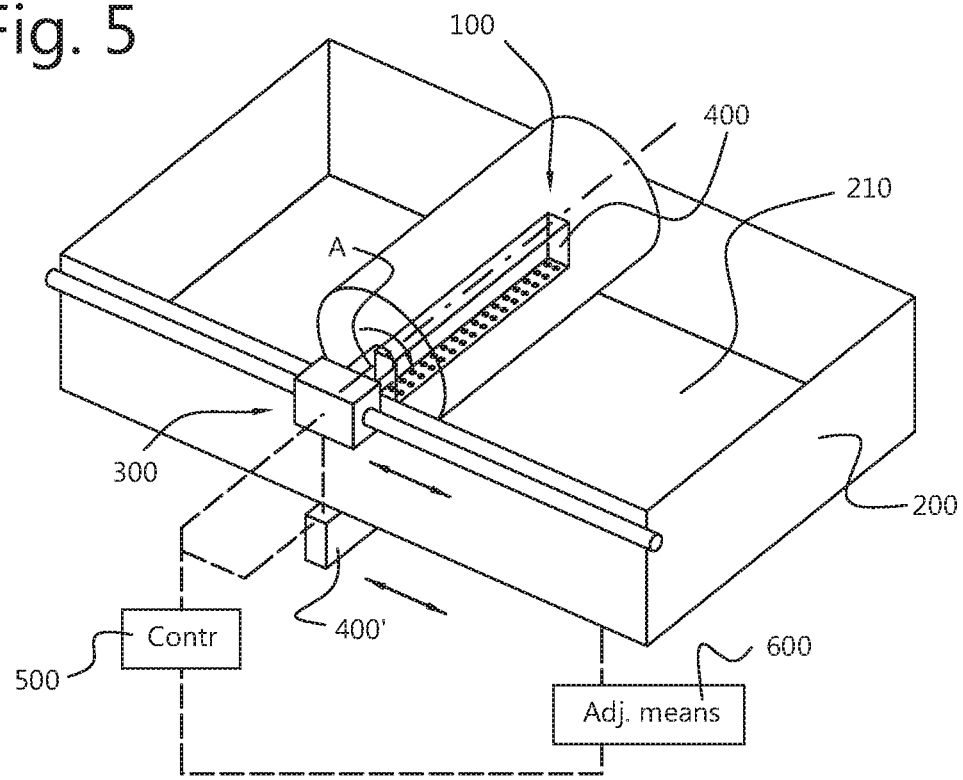
FIG. 5 illustrates a schematic perspective view of an exemplary embodiment of an apparatus for arranging a solidified material on a substrate or cylindrical carrier.

FIG. 5 illustrates schematically an apparatus for arranging a solidified material on a support surface. The apparatus comprises a container 200, a drum 100, a moving means 300, a first irradiating means 400, a second irradiating means 400', an adjustment means 600, and a controller 500. The controller 500 is configured to control the moving means 300, the first irradiating means 400 and the adjustment means 600, as indicated with dotted lines in FIG. 5. The first irradiating means 400 and/or the second irradiating means 400' may be coupled with the moving means 300, such that the first irradiating means and/or the second irradiating means are moved synchronously with the translation of the axis A of the drum 100. In the embodiment illustrated in FIG. 5, the drum 100 is provided with a shaft which is arranged in bearing blocks. The moving means are configured to move the bearing blocks along a guide means which extends in a direction perpendicular on the axis A of the drum 100, and parallel to the bottom wall 210 of the container 200. The adjustment means 600 may comprise a first adjustment means configured to adjust a distance between the drum 100 and a bottom wall 210 of the container 200, and/or a second adjustment means configured to change the distance between the first irradiating means and the support surface. The first adjustment means may be configured to move the axis A of the drum 100 vertically and/or to move the container 200. If the container 200 is moved vertically, this may be coupled with an adjustment of the second irradiating means 400' so that the irradiation area is adjusted accordingly. If the drum 100 is moved vertically, this may be coupled with an adjustment of the first irradiating means 400 so that the irradiation area is adjusted accordingly.

Figure 6:
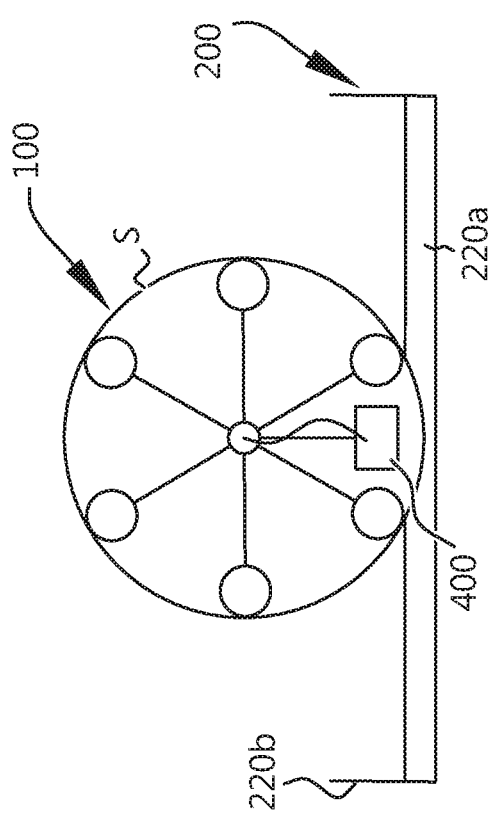

FIGS. 6-10 illustrate further variants of the apparatus in which the same or similar components have been indicated with the same reference numerals. In the embodiment of FIG. 6, a sleeve having a support surface S is arranged on a support structure 100. The support structure 100 comprises a series of rollers 110, 120 to support the sleeve, and some of the rollers are motorized rollers 120 for rotating the sleeve around an axis of the sleeve. The sleeve may be a closed sleeve and may have a length seen in the axial direction thereof, which is smaller than a length of the container 200.

Figure 7:
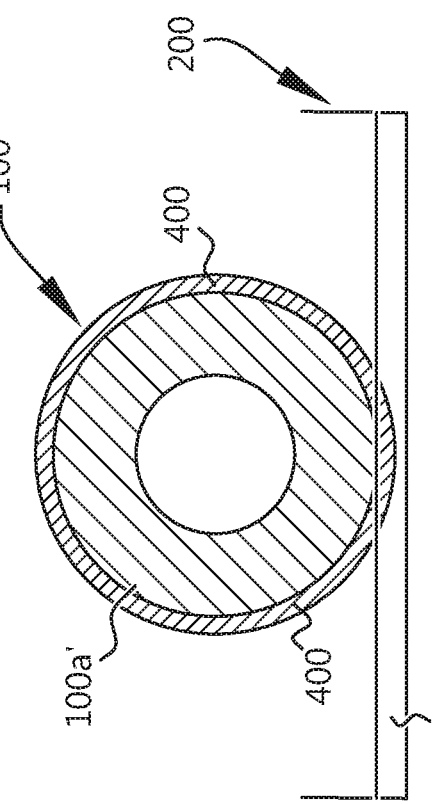

FIG. 7 illustrates a similar embodiment with an open sleeve having a support surface S. The sleeve may have a length seen in the axial direction thereof, which is larger than a length of the container 200 having walls 220a, 220b, and the two opposite walls 220a of the container oriented perpendicular on the axial direction may be made of a flexible material.

Figure 8:
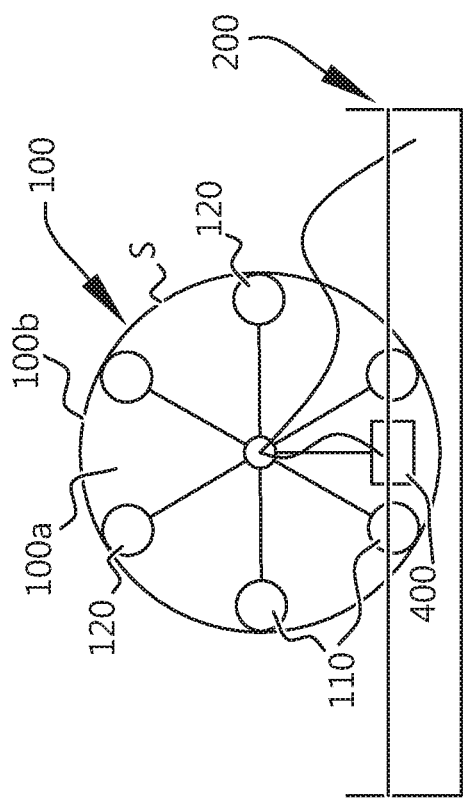

In the embodiment of FIG. 8, the apparatus comprises a drum 100 with partially closed flanges 100a' at opposite ends of a cylindrical surface 100b, such that no liquid enters in the drum 100 when the drum 100 is rotated.

Figure 9:
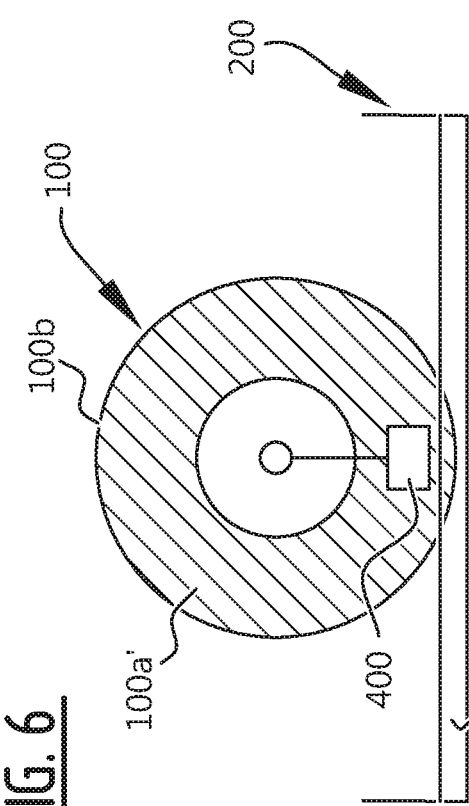

In the embodiment of FIG. 9, the apparatus comprises a drum 100 with partially closed flanges 100a' at opposite ends of a cylindrical surface, such that no liquid enters in the drum 100. Further the first irradiating means 400 are arranged along the entire circumference of the drum 100. Instead of arranged the first irradiating means 400 over 360°, it is also possible to arrange the first irradiating means 400 such that they extend over less than 360°, e.g. 180° or 90°.

In the embodiment of FIG. 10, the apparatus comprises a drum portion 100 which is arranged to be swung from left to right and back, see arrow R".

Figure 11:
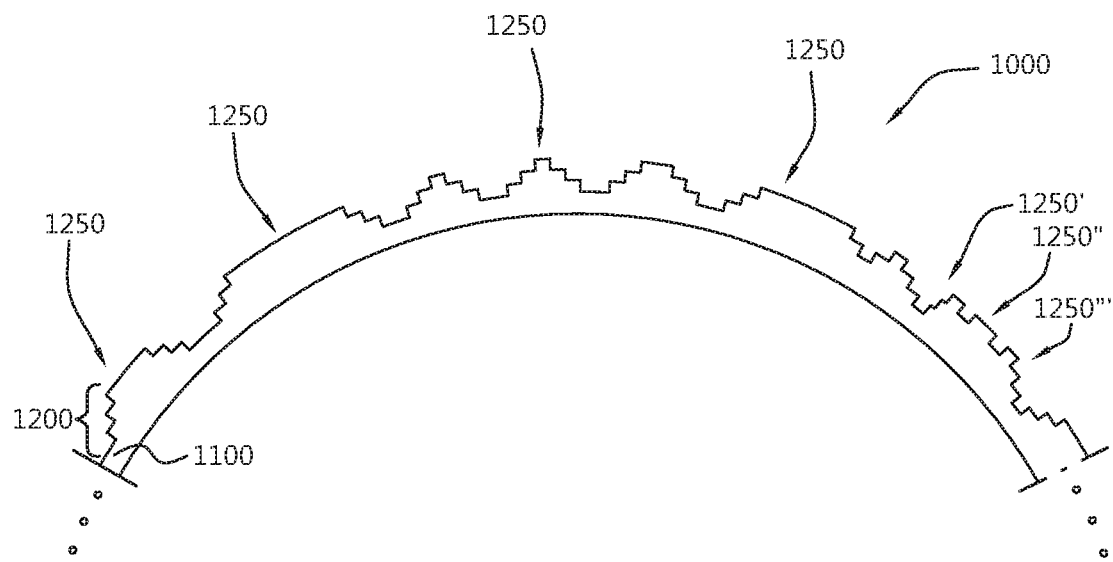
FIG. 11 is a schematic cross section of an exemplary embodiment of a generated relief carrier.

FIG. 11 is a sectional view of a relief carrier 1000 having a base layer 1100 and a relief layer 1200. The relief layer 1200 is formed as a stepped profile of solidified material. The stepped profile comprises a plurality of relief areas 1250, 1250', 1250", 1250'". Preferably, the base layer 1100 is a cylindrical base layer. The cylindrical base layer 1100 may subscribe a full circumference such that a relief sleeve is formed, or it may extend over less than 360°. The base layer 1100 may correspond at least partially with the substrate, in embodiments where a substrate is used. In other embodiments where no substrate is used, the base layer 1100 may be a layer which is formed using the solidifiable material. The stepped profile may be provided over more than 10°, preferably over more than 90°, more preferably over more than 180°, even more preferably over more than 270°, and most preferably over substantially 360° of the outer surface of the relief carrier 1000.

Figure 12:
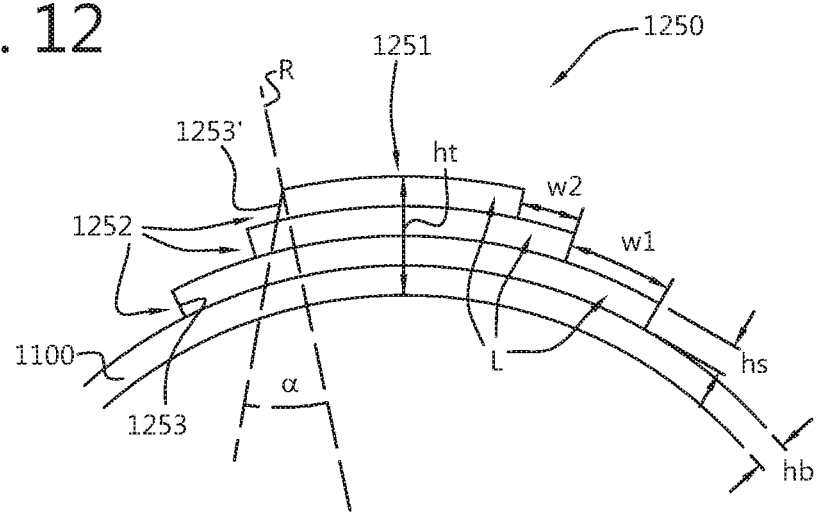
FIG. 12 is a schematic cross section in more detail of a relief area of the relief carrier of FIG. 11.

FIG. 12 shows in detail one relief area 1250. The relief area 1250 has an upper landing 1251 and at least one flight of steps 1252 between the base layer 1100 and the upper landing 1251. The upper landing 1251 may be a curved surface, e.g. a cylindrical surface which is concentric with the cylindrical base layer 1100. Each flight of steps 1252 may comprise a plurality of steps, preferably at least three steps, more preferably at least five steps. In the illustrated example, for reasons of simplicity, the flight of steps comprises only three steps 1252, but the skilled person understands that much more steps may be provided. The flight of steps 1252 may extend all the way from the base layer 1100 to the upper landing, as shown in FIG. 12. However, as shown in FIG. 11, when adjacent relief areas 1250', 1250", 1250'" are located close to one another, a flight of steps of a relief area 1250" may not extend all the way to the base layer 1100, and may be merged with a flight of steps an adjacent relief area 1250', 1250'".

A step may correspond with a single layer L built during one pass of the first and/or second irradiating means, but may also correspond with multiple layers L built during consecutive passes of the first and/or second irradiating means. FIG. 12 further shows some dimensions of the steps 1252. Preferably, the height hs of a step 1252 of the stepped profile is smaller than 0.5 millimeter, more preferably smaller than 300 micrometer. The height hs may even be smaller than 200 micrometer or smaller than 100 micrometer. The base layer 1100 may have a thickness hb which is for example between 0.5 and 3 mm. The relief carrier 1000 may have a maximum thickness ht which is smaller than 10 mm, preferably smaller than 7 mm. The steps 1252 of the stepped profile are delimited by riser walls 1253, 1253'. Riser wall 1253' is oriented at an angle α of less than 20° from a radial direction R, preferably less than 10° from the radial direction R. Preferably a riser wall 1253 is oriented substantially radially. The width w1, w2 of a step 1252 may vary, e.g. depending on the desired "steepness" of the flight of steps. For example, when two adjacent relief areas 1250 have to be positioned close to one another, the width w2 of an upper step may be relatively small, whilst one or more lower steps may have a width w1 which is larger than w2.

Figure 13A:
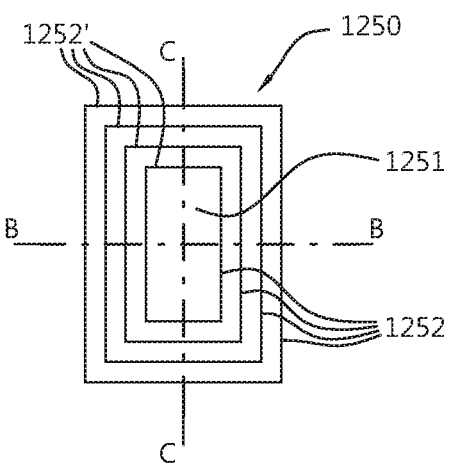
FIG. 13A, 13B, 13C show respectively a top view, a section along line B-B in FIG. 13A, and a section along line C-C in FIG. 13A of an exemplary embodiment of a relief area.
Figure 13B:
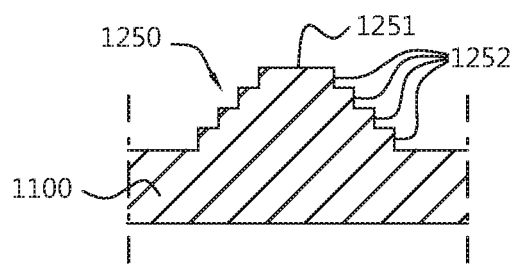
Figure 13C:
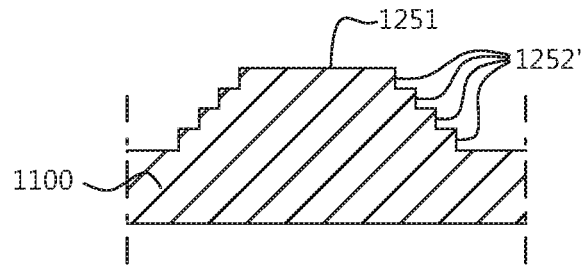

In a possible embodiment, the upper landing 1251 is substantially surrounded by the at least one flight of steps. In the embodiment of FIGS. 13A, 13B, 13C the upper landing 1251 has a substantially polygonal shape and there is provided a flight of steps 1252, 1252' at each edge of the polygonal upper landing 1251, see also the section along line B-B shown in FIG. 13B and the section along line C-C shown in FIG. 13C. The direction of line C-C may correspond with the axial direction A of the support structure. In the illustrated example the shape of the upper landing 1251 is rectangular, but the skilled person understands that the upper landing 1251 may have any shape, e.g. depending on the image that has to be printed.

Figure 14A:
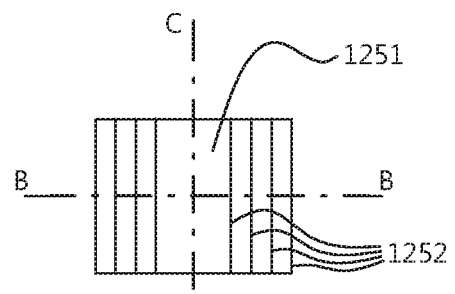
FIG. 14A, 14B, 14C show respectively a top view, a section along line B-B in FIG. 14A, and a section along line C-C in FIG. 9A of an exemplary embodiment of a relief area.
Figure 14B:
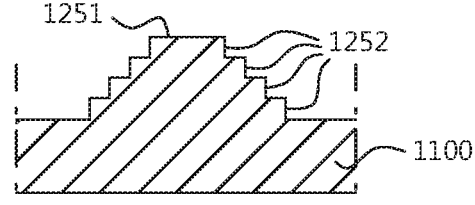
Figure 14C:
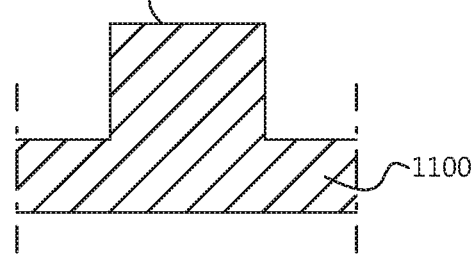

In another possible embodiment, the upper landing 1251 is not fully surrounded by the at least one flight of steps. In the embodiment of FIGS. 144A, 14B, 14C the upper landing 1251 has a substantially polygonal shape and there are provided two flights of steps 1252 at opposite sides of the polygonal upper landing 1251, see also the section along line B-B shown in FIG. 14B. The direction of line C-C may correspond with the axial direction A of the support structure. In the illustrated example the shape of the upper landing 1251 is rectangular, but the skilled person understands that the upper landing 1251 may have any shape, e.g. depending on the image that has to be printed.

Figure 15A:
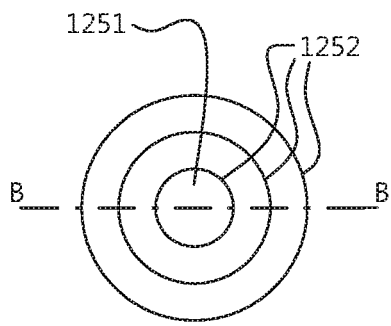
FIGS. 15A and 15B show respectively a top view and a section along line B-B in FIG. 15A of an exemplary embodiment of a relief area.
Figure 15B:
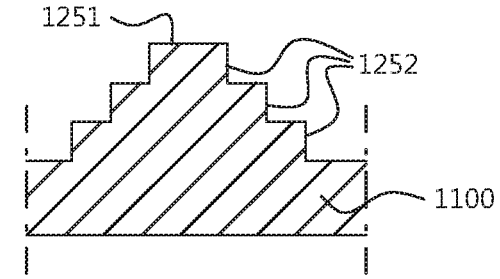

In yet another possible embodiment, the upper landing 1251 is circular or rounded. In the embodiment of FIGS. 15A and 15B the upper landing 1251 has a substantially circular shape and there is provided a circular flight of steps 1252 around the upper landing 1251, see also the section along line B-B shown in FIG. 15B. Of course, any other regular or irregular shape of upper landing and its surrounding steps is possible whereby in general, the contours of the different layers are similar to the shape of the landing but they may be different as well.

By application and solidification of the layers in a curved form, the surface layers of the three-dimensional structure, in particular a relief carrier are not mechanically stressed as comparable structures of the prior art, which are manufactured in a planar configuration and bent for mounting on a cylinder.

Further, by providing the steps to the relief areas, the relief areas 1250 are given additional stability. This may be especially useful for relief areas 1250 with a small upper landing 1251. In more advanced embodiments, the stepped profile may be determined in function of the image to be printed, and the number and/or size and/or shape of the steps may be adjusted in function of the image to be printed. For example, for large relief areas, less steps may be provided, whilst for small relief area more steps may be provided.

Figure 16:
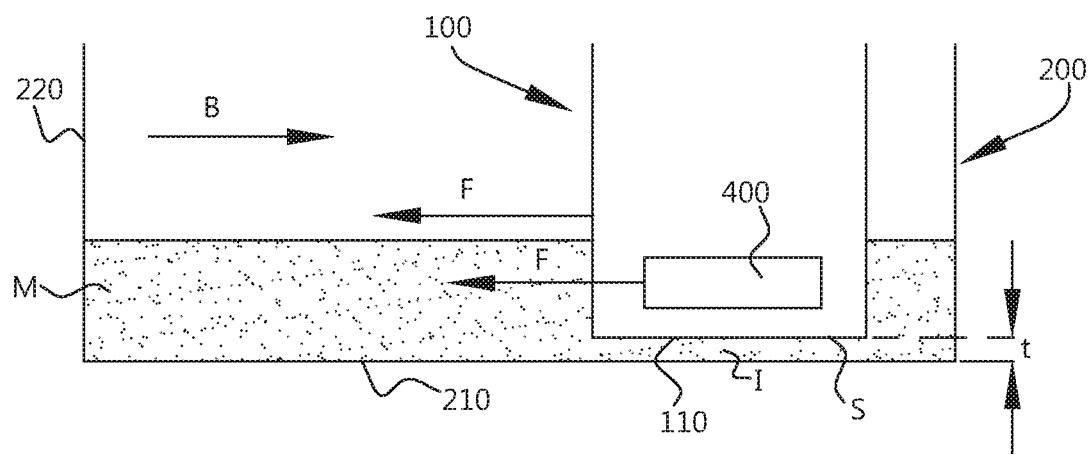
FIGS. 16-18 illustrate three further exemplary embodiments with a flat support surface.

FIG. 16 illustrates schematically another embodiment of an apparatus for arranging a solidifiable material M on a flat support surface S. The apparatus comprises a support structure in the form of a structure 100 with a flat bottom part 110 which may form the flat support surface S. Alternatively, a substrate may be fixed on the flat bottom part 110, in which case the lower surface of the substrate forms the flat support surface S. The apparatus further comprises a container 200 containing solidifiable material M, a first adjustment means (not shown) configured to adjust the distance t between the support structure 100 and the bottom wall 210, a first irradiating means 400, and a moving means (not shown) configured to move F, B the support structure 100 and the first irradiating means 400 parallel to a bottom wall 210 of the container 200. The container 200 has a bottom wall 210 and a side wall 220. The bottom wall 210 is arranged parallel to the support surface S. The support structure 100 is arranged at least partially in the container 200 such that the support surface S is at a determined distance t of the bottom wall 210. The first irradiating means 400 is configured to emit irradiation through the support surface S in an irradiation area I between the support surface S and the bottom wall 210 to solidify the solidifiable material in that area such that it adheres to the support surface S in that area. The first irradiation means 400 may be configured to selectively emit radiation in order to expose selected areas only. The support surface S is configured to allow the irradiation to pass through the support surface S.

Figure 17:
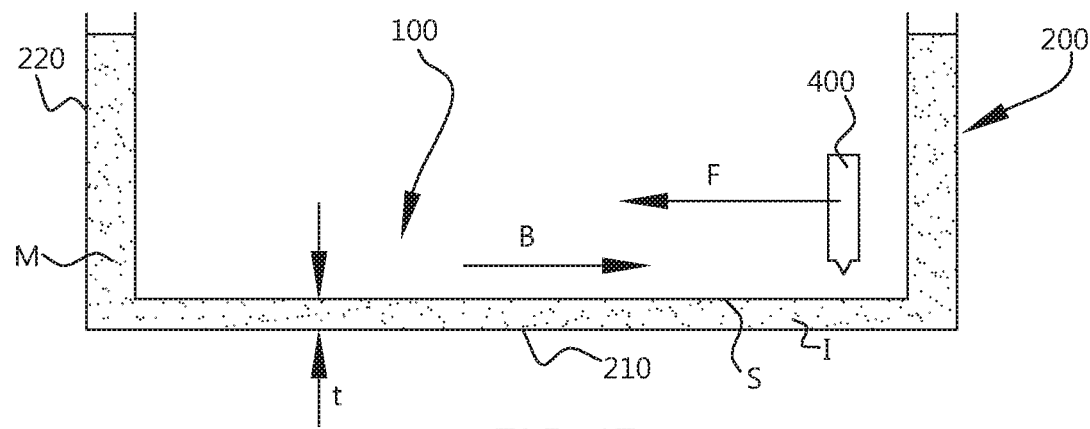

FIG. 17 illustrates an embodiment which is similar to the embodiment of FIG. 16 with this difference that the support structure 100 and the support surface S are larger, and that only the first irradiating means are moved F, B above the support surface S and parallel to the support surface S.

Figure 18:
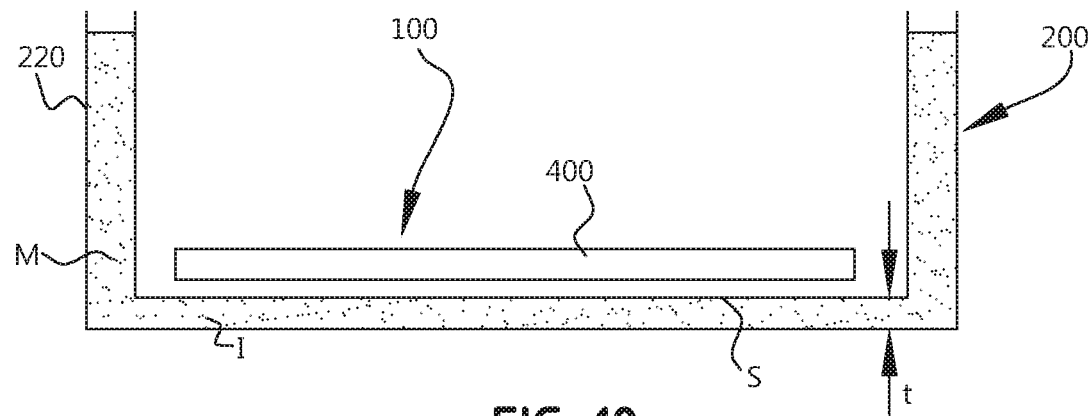

FIG. 18 illustrates yet another embodiment which is similar to the embodiment of FIGS. 16 and 17 with this difference that the support surface and the first irradiating means are not moved, and that the first irradiating means 400 are configured to emit irradiation in an irradiation area I which extends along substantially the entire support surface S.

A person of skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The embodiments are also intended to cover computers programmed to perform said steps of the above-described methods.

The functions of the various elements shown in the figures, including any functional blocks labelled as "controllers" may be provided through the use of dedicated hardware as well as hardware capable of executing software in association with appropriate software. When provided by a processor, the functions may be provided by a single dedicated processor, by a single shared processor, or by a plurality of individual processors, some of which may be shared.

Whilst the principles of the invention have been set out above in connection with specific embodiments, it is to be understood that this description is merely made by way of example and not as a limitation of the scope of protection which is determined by the appended claims.

The invention claimed is:

1. An assembly comprising a substrate and an apparatus for generating a three-dimensional structure using a solidifiable material (M), comprising:
   a. a drum providing a cylindrical support surface and being rotatable around a drum axis, wherein the drum is configured to carry a substrate in the form of a plate or cylinder, the substrate being intended to be part of the three-dimensional structure to be generated;
   b. a container for receiving the solidifiable material; and
   c. a first irradiating element arranged within the drum and configured to emit irradiation, through said support surface, in an irradiation area in the solidifiable material, between the substrate and the container to solidify the solidifiable material at the substrate; wherein the drum is configured to allow said irradiation to pass through the support surface,
   wherein the container has a wall arranged such that the substrate is at a determined distance (t) of the wall, wherein the irradiation area extends from the substrate to the wall, the first irradiating element being located above the wall of the container, and
   wherein the apparatus comprises a first mover configured to rotate the drum around the drum axis (A), and a second mover configured to translate the drum relative to the wall, such that the drum axis (A) is moved parallel relative to the wall of the container whilst rotating the drum around the drum axis (A); and
   a controller configured to control the first and second mover to rotate the drum around the drum axis up to 360° while translating the drum relative to the wall of the container.

2. The assembly of claim 1, wherein the first mover and the second mover are configured to move the support surface relative to the container, such that subsequent areas (Z1, Z2) of the support surface face the irradiation area during the moving.

3. The assembly of claim 1, wherein the first mover and the second mover are configured to translate and rotate the support surface relative to the wall, such that for each degree of rotation of the support surface, the support surface is translated relative to the wall over a distance which is within 10% of a value calculated as x multiplied with the outer diameter (d) of the support surface divided by 360 ($\pi*d/360$).

4. The assembly of claim 2, wherein the second mover is configured to translate the drum and/or to translate the container.

5. The assembly of claim 1, wherein the apparatus further comprises a first adjuster configured to change the distance between a wall of the container and the drum axis; and/or a second adjuster configured to change the distance between the first irradiating element and the drum axis.

6. The assembly of claim 5, wherein the controller is configured to control the first mover, the second mover, the first and/or second adjuster and the first irradiating element such that one or multiple layers of solidified material are formed on the substrate.

7. The assembly of claim 5, wherein the controller is configured to control the first mover, the second mover, the first and/or second adjuster and the first irradiating element such that at least one full layer of solidified material is formed on the support surface to form a floor.

8. The assembly of claim 5, wherein the controller is configured to control the first mover, the second mover, the first and/or second adjuster and the first irradiating element such that at least one structured layer of solidified material is formed.

9. The assembly of claim 1, wherein the wall is a bottom wall of the container.

10. The assembly of claim 1, wherein a second irradiating element is located outside the container and configured to irradiate a second irradiation area through the wall, wherein the second irradiation area may be the same or different from the irradiation area of the first irradiating element.

11. The assembly of claim 1, wherein the first mover is integrated with the drum so as to form a motorized drum.

12. The assembly of claim 1, wherein the second mover comprises a guide along which a shaft of the drum is guided.

13. The assembly of claim 1, wherein the controller is configured to control the second mover such that the second mover translates the drum relative to the container in a forward direction from an initial position to an end position, whilst the drum is being rotated, and next, in a backward direction from the end position back to the initial position, whilst the drum is being rotated and the irradiation continues.

14. An apparatus for generating a three-dimensional structure using a solidifiable material (M), comprising:
   a. a drum providing a support surface and having a drum axis, wherein the drum is configured to carry on the support surface the three-dimensional structure to be generated;
   b. a container for receiving the solidifiable material;
   c. a first irradiating element located within the drum and configured to emit irradiation, through said support surface, in an irradiation area in the solidifiable material, between the support surface and the container to solidify the solidifiable material; wherein the drum is configured to allow said irradiation to pass through the support surface;
   wherein the support surface is arranged at a predetermined distance of a wall of the container, the first irradiating element being located above the wall of the container,
   wherein the apparatus comprises a first mover configured to rotate the drum around the drum axis, and a second mover configured to translate the drum relative to the wall, such that the drum axis is moved parallel relative to the wall of the container whilst rotating the drum around the drum axis, wherein the first mover and the second mover are configured to translate and rotate the support surface relative to the wall, such that for each degree of rotation of the support surface, the support surface is translated relative to the wall over a distance which is within 10% of a value calculated as $\pi$ multiplied with the outer diameter (d) of the support surface divided by 360 ($\pi*d/360$),
   wherein the apparatus comprises an adjuster configured to change a distance between the first irradiating element and the support surface, and
   wherein the apparatus comprises a controller configured to control the first and second movers, the first irradiating element, and the adjuster, such that multiple layers of solidified material are formed to generate a three-dimensional structure on the drum.

15. An apparatus for generating a three-dimensional structure using a solidifiable material (M), comprising:
   a. a drum providing a support surface and having a drum axis, wherein the drum is configured to carry on the support surface the three-dimensional structure to be generated;
   b. a container for receiving the solidifiable material;
   c. a first irradiating element located within the drum and configured to emit irradiation, through said support surface, in an irradiation area in the solidifiable material, between the support surface and the container to solidify the solidifiable material; wherein the drum is configured to allow said irradiation to pass through the support surface;
   wherein the apparatus comprises a first adjuster configured to change a distance between a wall of the container and the support surface, the first irradiating element being located above the wall of the container,
   wherein the apparatus comprises a first mover configured to rotate the drum around the drum axis, and a second mover configured to translate the drum relative to the wall, such that the drum axis is moved parallel relative to the wall of the container whilst rotating the drum around the drum axis, wherein the first mover and the second mover are configured to translate and rotate the drum relative to the wall, such that for each degree of rotation of the support surface, the support surface is translated relative to the wall over a distance which is within 10% of a value calculated as x multiplied with the outer diameter (d) of the support surface divided by 360 ($\pi*d/360$),
   wherein the apparatus comprises a controller configured to control the first and second movers, the adjuster, and the first irradiating element, such that multiple layers of solidified material are formed,
   wherein the apparatus comprises a second adjuster configured to change a distance between the first irradiating element and the support surface, wherein the controller is configured to control the first and the second adjuster so that a distance between the wall and the first irradiating element remains the same during the forming of the multiple layers.

* * * * *